US008072286B2

(12) United States Patent
Johansson (10) Patent No.: US 8,072,286 B2
(45) Date of Patent: Dec. 6, 2011

(54) APPARATUSES AND A METHOD FOR CONTROLLING ANTENNA SYSTEMS IN A TELECOMMUNICATIONS SYSTEM (75) Inventor: Rune Johansson, Upplands Vasby (SE)

(73) Assignee: Telefonaktiebolaget L M Ericsson (publ) (SE)

( * ) Notice: Subject to any disclaimer, the term of this patent is extended or adjusted under 35 U.S.C. 154(b) by 375 days.

(21) Appl. No.: 12/523,295

(22) PCT Filed: Jan. 17, 2007

(86) PCT No.: PCT/SE2007/050025
§ 371 (c)(1),
(2), (4) Date: Jul. 15, 2009

(87) PCT Pub. No.: WO2008/088256
PCT Pub. Date: Jul. 24, 2008

(65) Prior Publication Data
US 2010/0045402 A1 Feb. 25, 2010

(51) Int. Cl.
H03H 7/38 (2006.01)
(52) U.S. Cl. .......................................... 333/17.3; 333/32
(58) Field of Classification Search .................. 333/17.3, 333/32, 132, 134, 135
See application file for complete search history.

(56) References Cited

FOREIGN PATENT DOCUMENTS

| EP | 0 564 114 A1 | 10/1993 |
| EP | 0 926 817 A1 | 6/1999 |
| GB | 2 152 760 A | 8/1985 |
| JP | 2004-320669 | 11/2004 |

OTHER PUBLICATIONS

International Search Report dated Sep. 7, 2007 (3 pages).
Written Opinion dated Sep. 7, 2007 (4 pages).
Office Action, Japanese Application No. 2009-546339, Jul. 23, 2011.

Primary Examiner — Stephen Jones
(74) Attorney, Agent, or Firm — Myers Bigel Sibley & Sajovec, P.A.

(57) ABSTRACT

The present invention relates to a method and an apparatus (20) for a radio frequency component (10), RF component, for use in antenna systems, wherein the RF component (10) is adapted to guide direct current, DC, power signals; control signals and RF signals, and wherein the RF component (10) is adapted to separate the DC power signals and the control signals from the RF signals. The apparatus according to the present invention comprises an impedance matching network interface (21) adapted to match at least one control signal of the separated control signals to at least one predetermined impedance value; and a DC and signalling controller (22) that is adapted to control, along DC paths, the DC power signals to at least a first port of the RF component (10), and adapted to control, along signalling paths, the control signals to at least a second port of the RF component (10), whereby the DC power signals and the control signals are controlled independently of each other. The present invention also relates to a radio frequency component that comprises an internal and/or an external interface used to connect the apparatus (10).

17 Claims, 10 Drawing Sheets

APPARATUSES AND A METHOD FOR CONTROLLING ANTENNA SYSTEMS IN A TELECOMMUNICATIONS SYSTEM

TECHNICAL FIELD

The present invention relates to antenna control in general and to apparatuses and a method for controlling of signalling and direct current (DC) power signals in RF components adapted for use in antenna systems in particular.

BACKGROUND

Today, mobile or radio telecommunication systems usually are outdoor cellular systems and indoor wireless systems, in which each coverage area of an outdoor cellular system or each coverage area of an indoor wireless system has at least one base station or an access point respectively. Each base station and each access point comprises at least one antenna for transmitting and receiving signals to/from user terminals of the systems. It is often desirable to use a common antenna system to transmit and receive signals. The transmitted signals and received signals may lie in different frequency bands. As an example, state of the art cellular frequency bands like AMPS operates at around 850 megahertz (MHz) and the PCS (Personal Communication System) at around 1900 MHz. Other Communication frequency bands include the PCN (Personal Communication Network) at approximately 1800 MHz, the JDC (Japanese Digital Cellular) at approximately 800 MHz and 1500 MHz, the GSM system (Global System for Mobile Communications) at approximately 850 MHz, 900 MHz, 1800 MHz and 1900 MHz, and wide band code division multiplexing (WCDMA) systems at approximately 1850 MHz to 2200 MHz. Among other bands are, the GPS system (Global Positioning System) operating at approximately 1575 MHz, Bluetooth at approximately 2400 MHz, WLAN (Wireless Local Area Network) at approximately 2400 MHz and 5000 MHz and WIMAX (Worldwide Interoperability for Microwave Access) operation in the range at approximately 2000 MHz to. 5800 MHz.

A problem with introducing and using different frequency bands is that antenna systems are getting more complex and also more electronics, more antennas and more cables are required in the antenna systems or close to the antennas. A common approach of minimizing the number of cables, electronics and antennas in antenna systems is to use feeder sharing, e.g. DC power sharing and/or signalling sharing between frequency bands, dual band tower mounted amplifiers and multi-band antennas. However, introducing more electronics, more cables and more antennas often require redirecting signalling paths and DC paths, which may introduce additional radio frequency losses which, as well known in the art, must be kept at a minimum, i.e. attenuated good enough because of the stringent requirements when it comes to the level of unwanted radiation on RF ports. The generated radio frequency losses are especially noticeable when new RF components are introduced in antenna systems for dealing with feeder sharing and signalling sharing.

In addition, advanced multi-band antenna systems are consuming more DC power and also require more complex signalling to effectively control active devices in advanced antenna systems, especially in antenna systems wherein antennas operating in different frequency bands (as described above) are co-located on the same antenna mast. DC power is, in such systems, often split in order to feed the different RF components in the different antenna systems. However, there is a limit on how many times the DC power can be split. If the DC power is split too may times, the available DC power may be to low and the RF components may hence not function properly.

Furthermore, input port/ports in RF components, residing in antenna systems, that do not have DC, must be provided with DC blocking components. Introducing new and different combinations of DC paths and/or signalling paths will therefore require additional tailor-made RF components with DC blocking. Thus, introducing additional or future systems operating in new frequency bands into existing antenna systems will unnecessarily be difficult if not impossible.

A further problem concerning co-located antennas, operating in different frequency bands, is that a correct impedance matching (usually to 50 Ohms) is hard to achieve when the signalling is split to more that one RF component of the antenna system. This is true regardless of the type of signalling i.e. low-frequency signalling or high-frequency signalling. In addition, an incorrect impedance matching makes it difficult to recombine the signalling or to further split the signalling. The possibility of splitting of the signalling is therefore also here limited.

An additional problem with advanced antenna systems operating in different frequency bands concerns the case where, for example, the DC power to an RF component operating at a first frequency band is interrupted. In such a case, it is desirable to switch the DC and signalling control to another RF component operating at a second frequency band, i.e. using the other RF component as a backup RF component. However, switching DC and signalling control to the other RF component is very complicated to achieve since the other RF component most probably includes a DC blocking component and the DC blocking component must therefore be removed in order for the RF component to take over the operation of the first RF component. In some RF components, removing a DC blocking component is not an easy task and the only solution is to completely replace the RF component. If this scenario occurs, the operation of the antenna system must be interrupted until a new RF component having no DC blocking component is installed. In addition, it is possible for the RF component or components to be improperly connected during installation so that the antenna system will not work as desired. Determining the cause of the malfunction or locating an improperly connected device is usually a very difficult task leading to additional delays in "reviving" the antenna systems.

Today, there exist mainly two solutions to deal with the DC and signalling paths in RF components. One common solution is to provide, in advance, a DC blocking capacitor in the RF components. In such components, although the DC blocking capacitor can effectively block the DC as desired, the signalling is still forced to follow a predetermined signal path or signal paths. These types of components are therefore most usually tailor-made in order to fulfil the requirements of the customer. In other words, a supplier of RF components has to manufacture the RF components in different versions and models depending on the requirements of the customers.

Another common solution is to manufacture only one model but using external DC blocking and signalling blocking components. A drawback with this solution relates to additional radio frequency losses introduced when external components are connected to RF components. Furthermore, this solution introduces additional costs of antenna systems; especially as RF connectors and RF components generally already bring substantial costs to antenna systems. Thus introducing additional components will certainly raise costs, which makes this solution unattractive to operators and/or RF component suppliers. In addition, although external DC blocking components which will normally be seen as open circuits for used signalling frequencies may be utilized, there is a risk that the signalling results in a short circuit if the external component is placed at a position where the cable length is close to N·λ/4, where λ is the wavelength and N is an odd integer number i.e. 1, 3, 5, 7 etc.

SUMMARY

As stated above, several problems arise when introducing and using different frequency bands in antenna systems which are getting more complex, and therefore there is a need for apparatuses and a method that can reduce complexity and that can provide an improved control of signalling and DC power signals in antenna systems and particularly in RF components of antenna systems.

According to a first aspect of the present invention, the above stated problems are solved by means of an apparatus for at least one RF component for use in antenna systems, wherein the RF component is adapted to guide DC power signals, control signals and RF signals, and wherein the RF component is also adapted to separate the DC power signals and the control signals from the RF signals. The apparatus according to the present invention comprises an impedance matching interface network adapted to match at least one signal of the separated control signals to at least one predetermined impedance value; and a DC and signalling controller that is adapted to control, along DC paths, the DC power signals to at least a first port of the RF component; and adapted to control, along signalling paths, the control signals to at least one second port of the RF component, whereby the DC power signals and the control signals are controlled independently of each other.

According to a second aspect of the present invention, the above stated problems are solved by means of a radio frequency component, RF component, adapted to be used in antenna systems, wherein the RF component comprises at least an internal or external interface for connecting an apparatus whereby DC power signals and control signals are controlled independently of each other.

According to a third aspect of the present invention, the above stated problems are solved by means of a method for control of at least one radio frequency component, RF component, for use in antenna systems, wherein the RF component is adapted to guide DC power signals, control signals and RF signals, and wherein said RF component is adapted to separate the DC power signals and the control signals from the RF signals. The method according to the present invention comprises: impedance matching at least one signal of the separated control signals to at least one predetermined impedance value; controlling, along DC paths, the DC power signals to at least one first port of the RF component, and controlling, along signalling paths, the control signals to at least one second port of the RF component, whereby the DC power signals and the control signals are controlled independently of each other.

An advantage with the present invention is that the control of the DC power signals and the control signals in RF components is easily achieved without necessarily develop new tailor-made RF components.

Another advantage with the present invention is that configuration and/or reconfiguration of RF components in antenna systems is possible without necessarily replacing expensive RF components.

A further advantage with the present invention is that even if the control signals and the DC power signals are to be split, an accurate matching of the impedance is correctly performed using the apparatus according to the present invention.

Yet another advantage with the present invention is that the introduction of new frequency bands into existing antenna systems may be achieved without redesigning existing RF components.

Other advantages of the present invention will become apparent from the following detailed description, when considered in conjunction with the accompanying drawings, attention to be called to the fact, however, that the following drawings are illustrative only, and that changes may be made in the specific embodiments illustrated and described within the scope of the appended claims.

DETAILED DESCRIPTION

Figure 1:
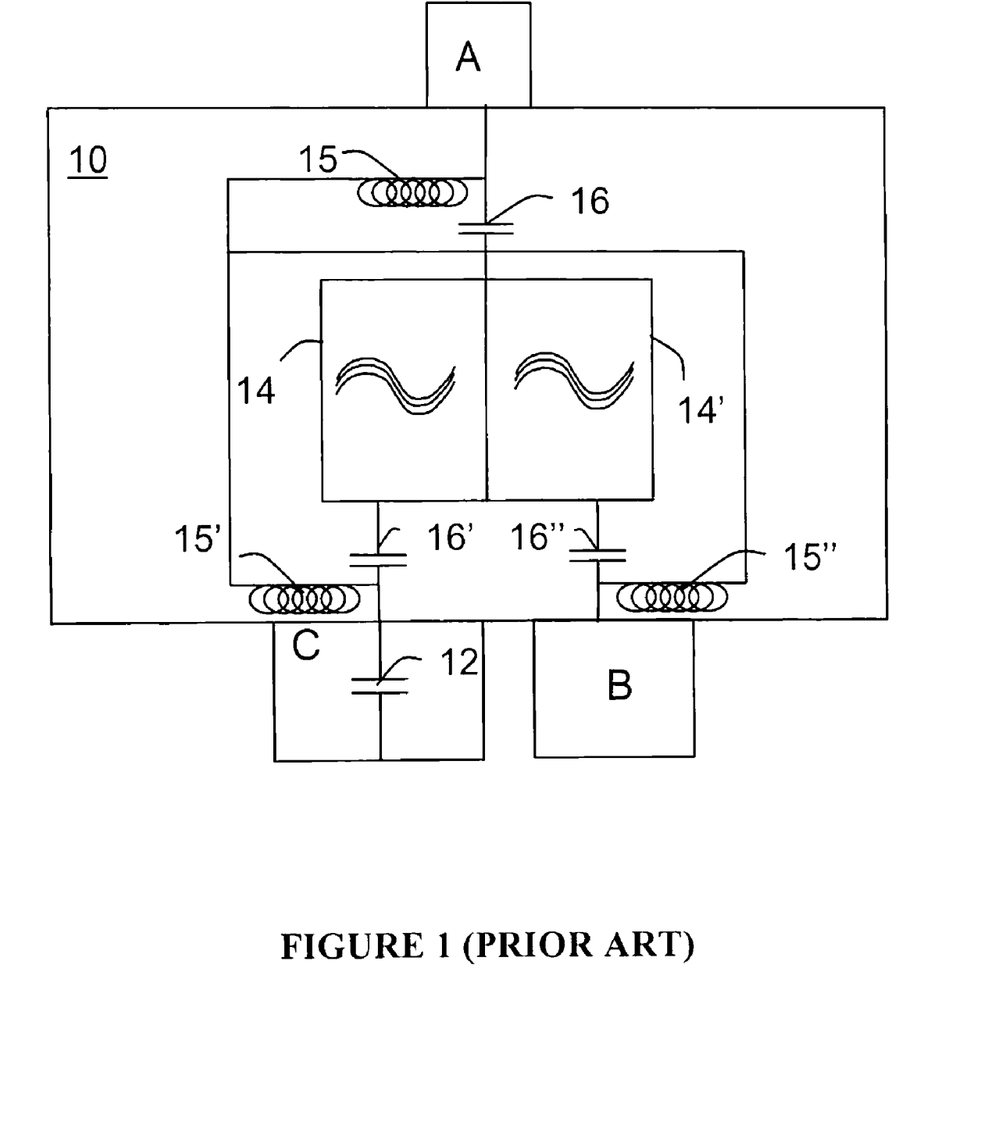
FIG. 1 is a schematic cross section illustration of an exemplary prior art DC blocking component connected to an RF port of an RF component.

FIG. 1 illustrates a schematic cross section of an exemplary prior art DC blocking component 12 connected to a port of an RF component 10 representing a diplexer. The diplexer 10 comprises three ports A, B and C used to receive or transmit RF signals, control signals and DC power signals to/from other components. The diplexer 10, also known as a combiner, is a device that combines the radio frequency output of two or more radio transmitters into a single output. As an example, a GSM radio transmitter operating at a frequency band of about 850 MHz may be connected to port B, whereas a WCDMA radio transmitter operating at a frequency band of about 1900 MHz may instead be connected to port C. The diplexer 10 then combines the signalling from the GSM radio transmitter and the WCDMA radio transmitter into a single output at port A.

The diplexer 10 is also able to split a signal to two or more loads, dependent on the frequency used, i.e. diplexer 10 can split a signal into different signal bands. Often a diplexer is used to route signals, based on frequency, to two different receivers. In order for the diplexer 10 to combine or split signals of different frequencies, it is equipped with filters 14 and 14' as illustrated. As an example, a signal of different frequencies (e.g. GSM 800 MHz and WCDMA 1900 MHz) inputted to port A may be split such that a first receiver operating at a first frequency band (800 MHz) and connected to e.g. port B receives a GSM signal whereas, a second receiver operating at the second frequency band (1900 MHz) and connected to port C receives a WCDMA signal.

Some standard components are also illustrated in FIG. 1, representing inductors 15, 15' and 15" and capacitors 16, 16' and 16". The DC blocking capacitor 12 which is connected to port C is able to block the DC power signals at that port only. The reason why a DC blocking capacitor is used might be that port C in diplexer 10 is selected to pass RF signals and to block DC power signals and control signals, whereas port A or port B are used to supply DC currents or voltages to diplexer 10 or to other RF components connected to diplexer 10. In addition, the DC blocking capacitor 12 prevents DC power and control signals from being fed from port A and/or port B towards a load, e.g. a base station or a radio base station, connected to port C. This is because DC power blocking and signalling blocking can not be performed at the base station due to the risk of the signalling becoming short circuit.

Thus the DC blocking capacitor 12 which is usually a stand-alone component is connected or disconnected to/from the RF component, e.g. the diplexer 10, depending on the initial configuration of the RF component. However, sometimes there is desired to switch DC to another port of the RF component that is already equipped with a DC blocking capacitor. In such a case, the DC blocking component has to be removed. Thus, each time a reconfiguration of the RF component is required, the DC blocking capacitor has to be removed or connected to a RF port.

In the following, exemplary embodiments of the present invention will be described with reference to a diplexer merely for purposes of illustrating the structures and advantages of the present invention. The present invention is not in anyway restricted to a diplexer RF component. Examples of RF components that may be used are: duplexers, couplers, splitters, filters, hybrids, antennas, tower mounted amplifiers. RF-boosters, etc.

Figure 2:
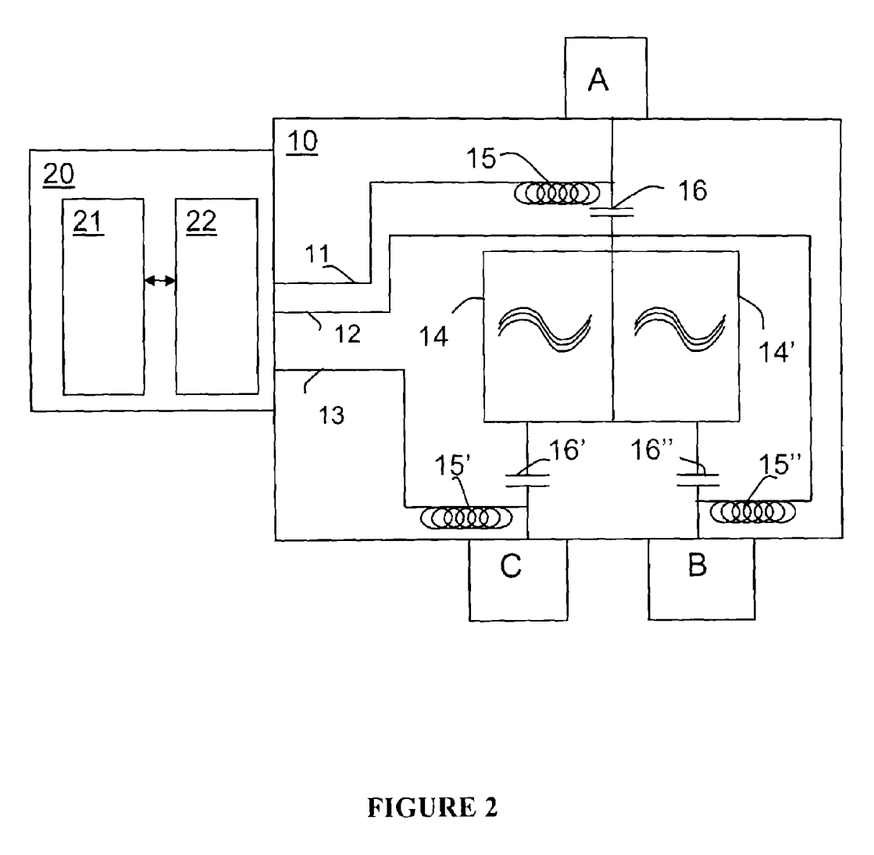
FIG. 2 is a schematic cross section illustration of an apparatus for an RF component, according to an embodiment of the present invention.

FIG. 2 illustrates a schematic cross section of an apparatus 20 for a diplexer RF component 10, according to an embodiment of the present invention.

As illustrated in FIG. 2, the diplexer 10 is composed of a first port A, second port B and third port C which may all be used to receive/transmit or guide RF signals, control signals and DC power signals to/from other components in the antenna system that the diplexer 10 is connected to. The RF component 10 is also responsible in separating control signals and DC power signals from RF signals. Similarly to the diplexer of FIG. 1, the RF component 10 comprises filters 14 and 14'; inductors 15, 15' and 15" and capacitors 16, 16' and 16". Note that the RF component 10 may comprise additional filters, inductors, capacitors or other electronic components.

In addition to the three RF ports A, B, and C, an apparatus 20, according to the present invention, is provided connected to the diplexer 10 as illustrated in FIG. 2. Apparatus 20 is according to an embodiment of the present invention, a stand-alone apparatus adapted to be connected to the RF component 10 via at least one pin of an external interface of the RF component 10. The three ports A, B and C of diplexer 10 are respectively connected to apparatus 20 via paths 11, 12, and 13. Apparatus 20 is therefore able, via paths 11, 12 and 13 to control all DC power signals and all control signals that are incident to any port A B and/or C of diplexer 10. In addition, DC power signals and control signals are controlled independently of each other as will be exemplified and illustrated below.

It should be mentioned that apparatus 20 may be physically and directly connected to one or several ports of the RF component 10.

As shown in FIG. 2, apparatus 20 is, according to the present invention, comprised of at least an impedance matching interface network 21, and a DC and signalling controller 22. The impedance matching interface network 21 is used to match at least one signal of the control signals incident to ports A, B and/or C, to a predetermined characteristic impedance value which usually is 50 Ohms. However, any suitable impedance value may be matched to. In addition, the impedance matching network 21 and the DC and signalling controller 22 are connected together in such a way that output signals from the DC and signalling controller 22 are used as input signals to the impedance matching interface network 21 in order for the matching network 21 to correctly match the separated control signals to a predetermined impedance value. The impedance matched signals are subsequently used as inputs to the DC and signalling controller 22. This is indicated in FIG. 2 by the bidirectional arrow between the DC and signalling controller 22 and the impedance matching interface network 21.

It should be noted that for all embodiments of the present invention, the impedance matching interface network 21 and the DC and signalling controller 22 may be integrated in a signal unit. In addition, if a splitting of the separated control signals and/or a combination of one or several control signals is performed at the impedance matching interface network 21, a correct impedance matching to a predetermined characteristic impedance value must be performed at the matching network 21. As mentioned earlier the characteristic impedance value may be 50 Ohms.

Hereinafter, some exemplary embodiments of apparatus 20 in accordance with the invention will be described and illustrated with reference to FIGS. 3a-3d. Note that the three-port RF component 10 is described merely for purposes of illustrating the structure and advantages of the invention. The present invention is therefore not in any way limited to a three-port RF component. In addition, the antenna system to which the RF component 10 is to be connected to may be single band antenna systems and/or dual band antenna systems and/or multi-band antenna systems.

Figure 3A:
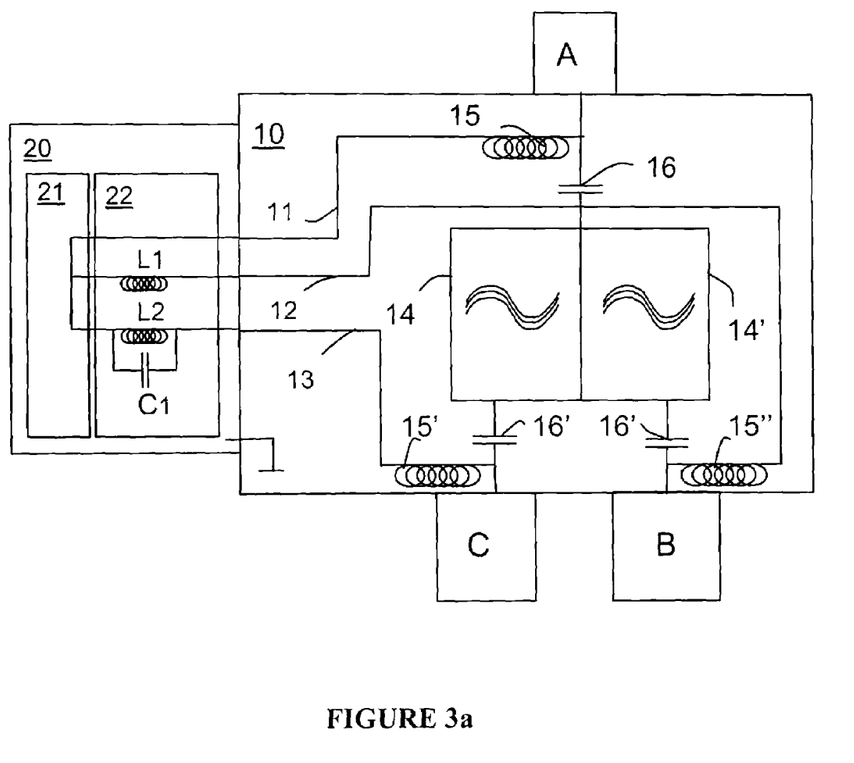
FIG. 3a is a schematic cross section illustration of a first structure of an apparatus for an RF component, according to an embodiment of the present invention.

Referring to FIG. 3a, let us assume that RF signals, control signals and DC power signals are received at port A. The diplexer 10 then separates the DC power signals and the control signals from RF signals, and routes the DC power signals and the control signals towards apparatus 20 via path 11. As illustrated in FIG. 3a, the DC and signalling controller 22 of apparatus 10 controls the DC power signals, along DC paths, and controls the control signals, along signalling paths, according to the following: The DC power signals and the control signals incident to the DC and signalling controller 22 from port A via path 11 are independently controlled in such a way that only the DC power signals are controlled towards the first port B via path 12. This is because the inductor with inductance $L_1$ has no effect at DC (i.e. an inductor passes direct current). Further, the DC power signals and the control signals are controlled towards the second port C via path 13 because the inductor with inductance $L_2$ passes DC while the capacitor with capacitance $C_1$ blocks the DC power signals but is here transparent to the control signals. Thus, port C receives both the DC power signals and the control signals via path 13. The value of the inductance $L_1$ and the value of the capacitance $C_1$ are chosen such that the total impedance in the DC and signalling controller is 50 Ohms or as close to 50 Ohms as possible.

As illustrated in FIG. 3a, the impedance matching network interface 21 receives the outputs from the controller 22 and appropriately matches the impedance of the separated controlled signals received via path 11, prior to forwarding them back towards the DC and signalling controller 22.

It should be mentioned that the impedance matching performed by the matching network 21 is necessary if a mismatch in the impedance is detected by the matching network 21. Thus, the matching network 21 is, according to the present invention, provided to ensure that a correct impedance matching is performed prior to controlling the DC power signals and the control signals by the controller 22.

Note also that control signals and DC power signals may be simultaneously incident to port B and/or port C and controlled by the DC and signalling controller 22, along DC paths and signalling paths towards any port of the RF component 10. As an example, if DC power signals and control signals are inputted to port B, DC power signals and control signals are controlled towards both port A and port C when an appropriate impedance matching is performed in the matching network 21.

Figure 3B:
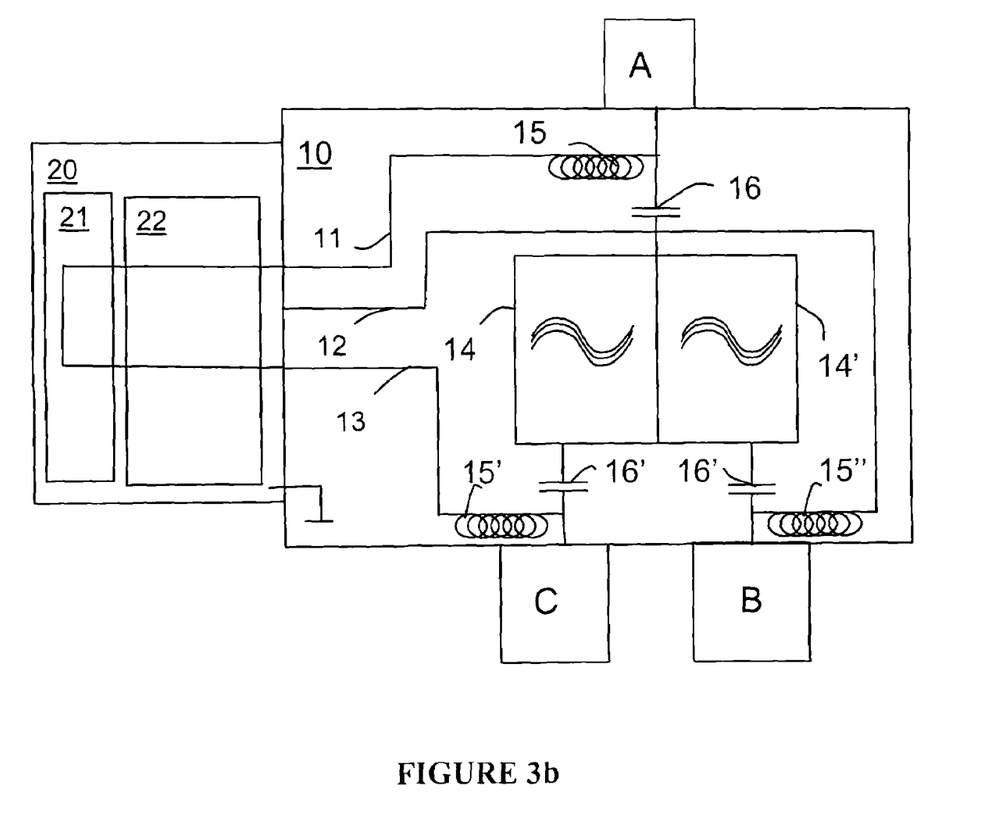
FIG. 3b is a schematic cross section illustration of a second structure of an apparatus for an RF component, according to an embodiment of the present invention.

Referring to FIG. 3b, there is illustrated another exemplary embodiment of apparatus 20 according to the present invention. It is here assumed that the RF component 10 is still responsible in receiving RF signals; control signals and DC power signals and also is responsible in separating control signals and DC power signals from RF signals.

In this scenario, the DC and signalling controller 22 is used to control the DC power signals and the control signals incident to port A (or incident to port C) towards port C (or towards port A), whereas port B is completely blocked from receiving any DC power signals or any control signal. Apparatus 20 thus acts as a DC blocker and signalling blocker with respect to port B. The DC and signalling controller 22 thus provides, in this scenario, a low impedance between paths 11 and 13, along which the DC power signals and the control signals are controlled to port C, whereas the controller 22 provides a high impedance between DC paths 1 and 12 such that no DC power signals are routed towards port B. Again, the impedance matching network 21 is here used to match, if necessary, the control signals received from the DC and signalling controller 22, to a predetermined impedance value.

Figure 3C:
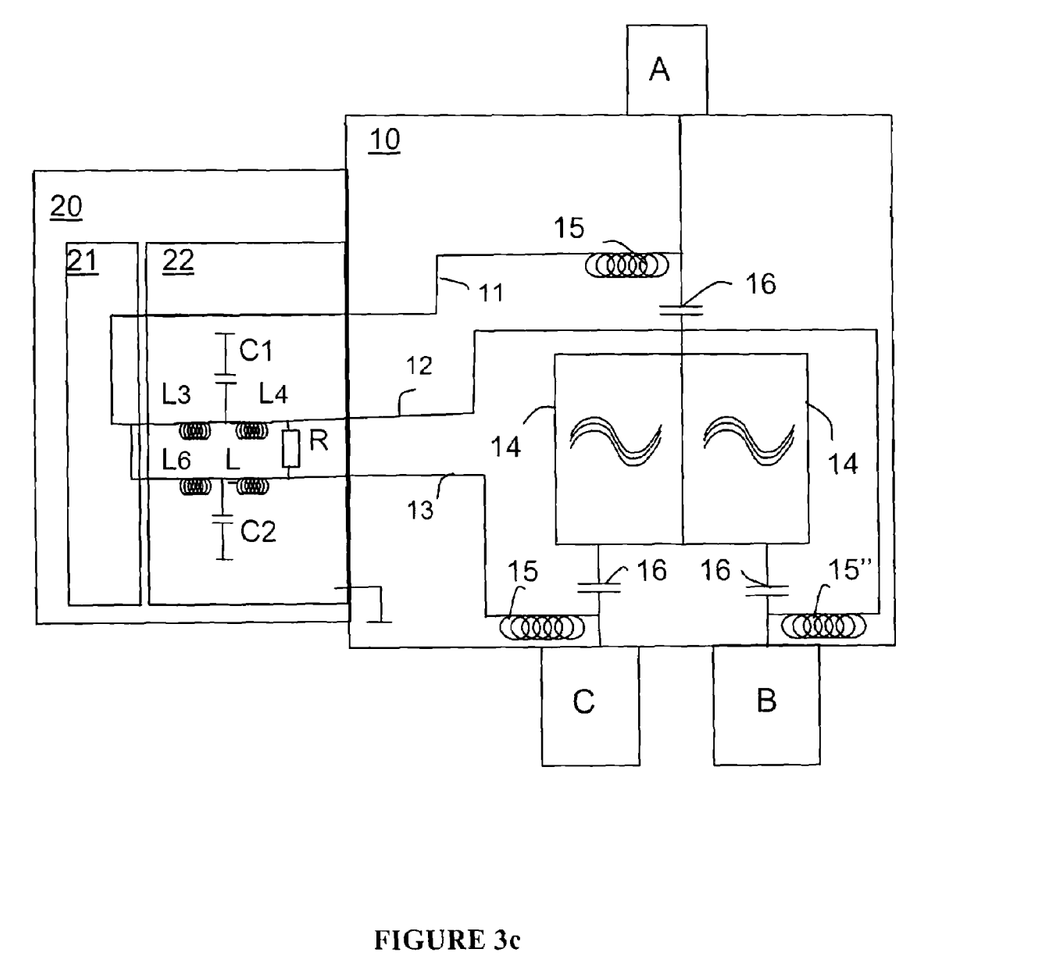
FIG. 3c is a schematic cross section illustration of a third structure of an apparatus for an RF component, according to an embodiment of the present invention.

Referring to FIG. 3c, there is illustrated another exemplary embodiment of apparatus 20 according to the present invention. The same assumption made above concerning the separation of control signals and DC power signals from RF signals is also applicable in this exemplary embodiment. In this scenario, the inductances $L_3$ and $L_4$ of the inductors connected to path 12 (or port B) and the inductances $L_5$ and $L_6$ of the inductors connected to path 13 (or port C) have been chosen such that they all are transparent to control signals. Therefore, if DC power signals and control signals are inputted to port A of the RF component 10, the DC and signalling controller 22 of apparatus 20 will control DC power signals, along DC paths, and the control signals, along signalling paths towards both port B and port C. Similarly, if DC power signals and control signals are incident to port B or port C, apparatus 20 will control via the DC and signalling controller 22, the DC power signals and the control signals towards port A. Again, the impedance matching interface network 22 is adapted to match the impedance or impedances to a predetermined impedance value. Further, the value of the inductances $(L_3, L_4, L_5, L_6)$; the value of the capacitances $(C_1, C_2)$ and the value of the resistance (R) are chosen such that the total impedance in the DC and signalling controller 22 is 50 Ohms or as close to 50 Ohms as possible.

Figure 3D:
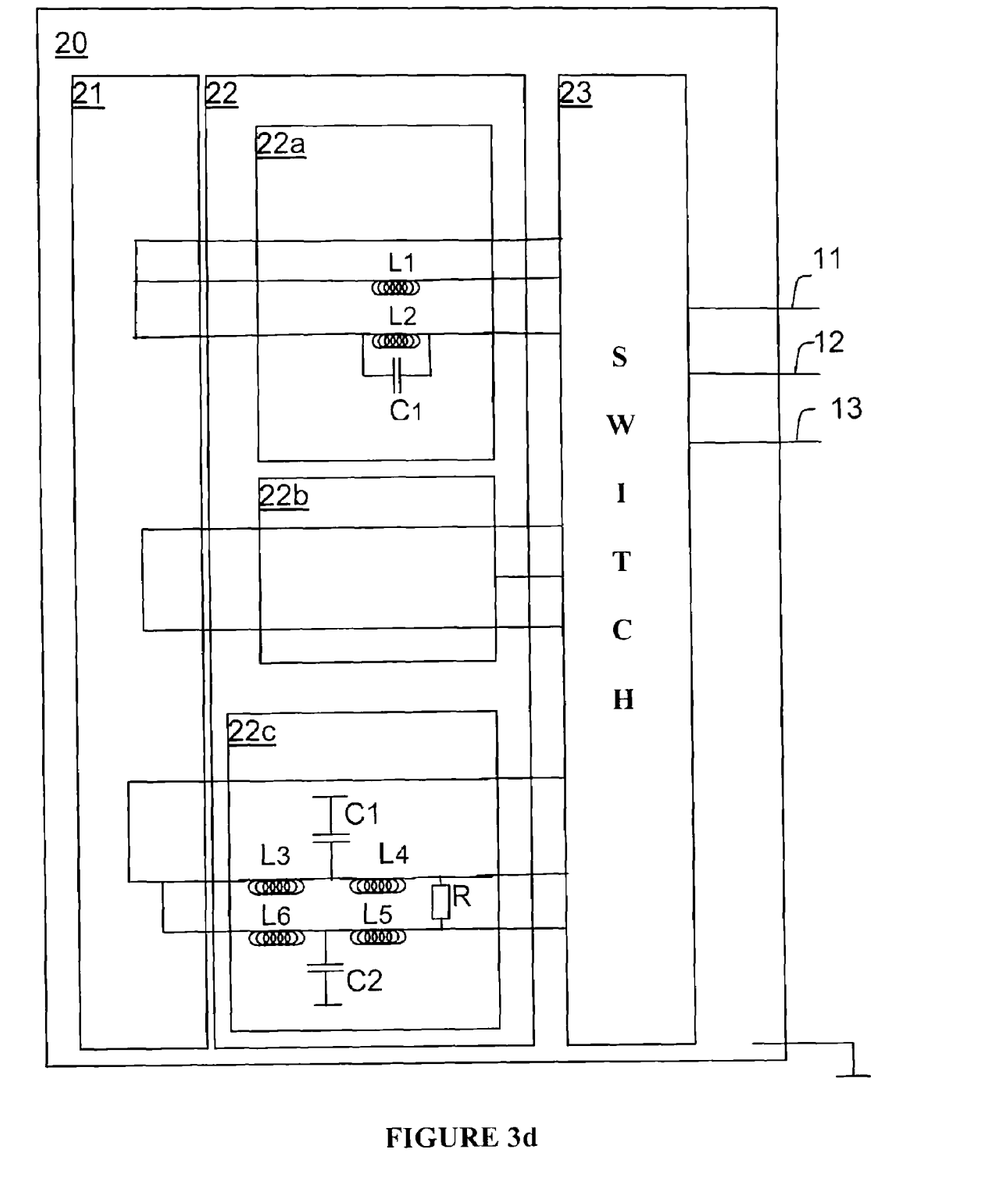
FIG. 3d is a schematic cross section illustration of fourth structure combining the structures of FIGS. 3a, 3b and 3c, of an apparatus for an RF component, according to an embodiment of the present invention.

Referring to FIG. 3d, illustrating all three embodiments of apparatus 20 described above, combined together in a single apparatus 20 with the help of a integrated switch 23 used to select the appropriate function of the DC and signalling controller 22. Note that the RF component 10 has been omitted in FIG. 3d merely for purposes of better understanding the functionality of apparatus 20 according to the present invention, and only paths 11, 12 and 13 are shown which represent respectively port A, B and C of the RF component 10. As illustrated in FIG. 3d, a switch 23 is located in between the DC and signalling controller 22 and paths 11, 12 and 13 of the RF component 10. Thus, depending on the selected function and/or the desired configuration or reconfiguration of the RF component 10, apparatus 20 will control the DC power signals, along DC paths, and control the control signals, along signalling paths, through block 22a, block 22b, and/or block 22c. Block 22a represents the scenario already described in conjunction with FIG. 3a; block 22b represents the scenario described with reference to FIG. 3b and block 22c illustrates the scenario described in conjunction to FIG. 3c.

The function of the impedance matching network 21 of FIG. 3d is similar to all embodiments described earlier, i.e. to match the control signals to a predetermined impedance value.

Figure 4:
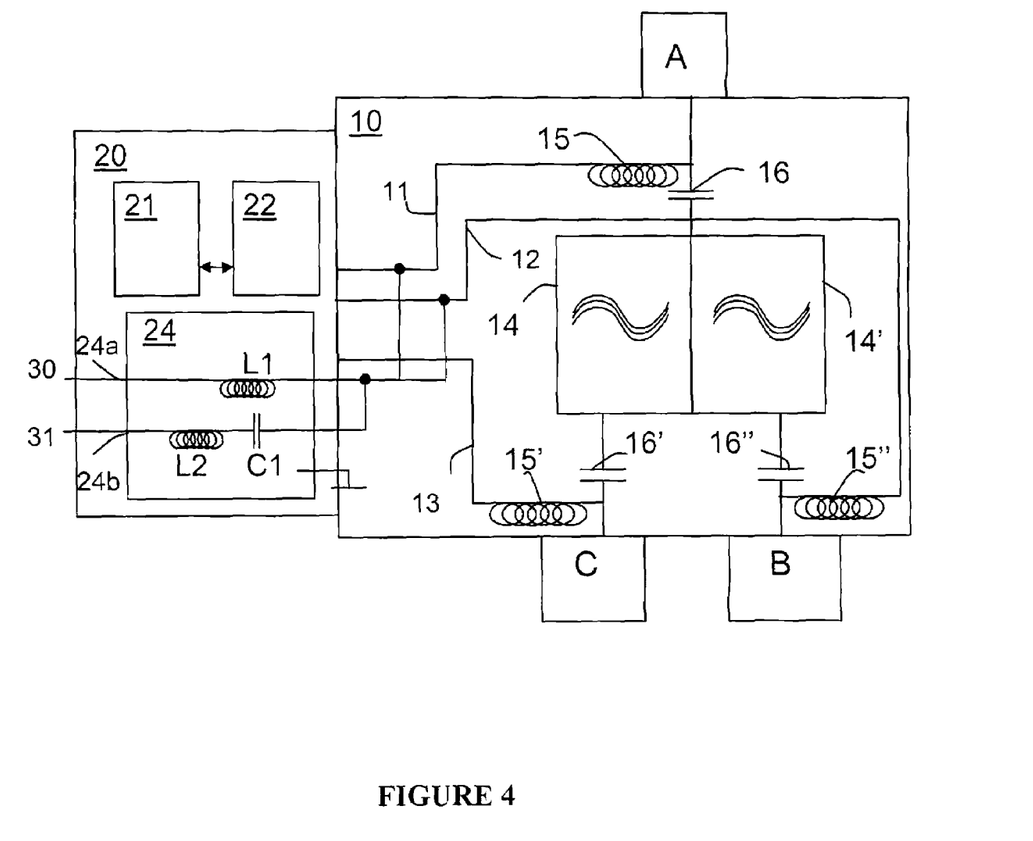
FIG. 4 illustrates a schematic cross section illustration of fifth structure of an apparatus for an RF component, according to an embodiment of the present invention.

FIG. 4 illustrates another exemplary embodiment of an apparatus 20 according to the present invention. As shown in FIG. 4, in addition to the DC and signalling controller 22 and the matching network 21, apparatus 20 further comprises a DC power feeder 24 for feeding DC power signals 30 to at least one port of the RF component 10 via at least one interface 24a through which DC power is injected from at least one external power source. The DC power signals 30 may be fed simultaneously to port A, B, and C or individually to port A, B or port C via apparatus 20. The reason why DC power is injected externally from a power source is that advanced antenna systems consumes a lot of DC power, and the maximum power level from e.g. a radio base station of a telecommunications system is often a compromise since it has direct impact both on cost and on system performance. For example, an additional radio base station (RBS), or an additional RF component connected to an available port of the RF component 10, may not operate properly unless enough DC power is injected to that port, and therefore, a DC power feeder 24 is, in accordance with the present invention, provided to open up the possibility to easily inject DC power from one or several external power sources when needed.

According to a further embodiment of the present invention, the DC power feeder 24 is also used to inject control signals 31 from an external signalling source through a second interface 24b as illustrated in FIG. 4. Note that the control signals 31 and DC power signals 30 may be injected through a single interface 24a or 24b. However, if control signals 31 and DC power signals 30 are injected simultaneously through interface 24b, the DC power is blocked because of the capacitor $C_1$, whereas interface 24a passes both DC power signals 30 and control signals 31.

According to the present invention, the control signals 31, being of lower frequencies than the RF signals, comprise signals in accordance with the Antenna Interface Standard group protocol, AISG, and/or the Ericsson Remote Tilt protocol, RET, and/or the Ericsson Tower Mounted Amplifier control protocols, TMA.

The protocols mentioned above are well known to facilitate the introduction of antenna line products with remote control and monitoring facilities, and aim to ensure basic interoperability of antennas and control infrastructure as described in "AISG Standard No. AISG V2.0" 13 Jun. 2006.

According to the present invention, the control signals 31 may be used to remotely control antenna line devices to which the RF component 10 is connected via apparatus 20.

As an example, the beam tilt and mast head amplifiers of the antenna system to which the RF component is connected, may be remotely altered using control signals according to one or several protocols mentioned above. The control signals 31 may further be used by apparatus 20 to supervise/monitor the installation of different components in the antenna system, and to check if components connected to port A, B or C operate correctly. In case one of the components are checked to be improperly connected or experiences a malfunction, the control signals may be controlled by apparatus 20 to the properly working RF ports until replacing the component or components that are malfunctioning. This way, the need to shut down the whole antenna system is eliminated due to the redundancy introduced by apparatus 20 according to the present invention. In addition, the control signals 31 may be ejected or injected from/to apparatus 20 via interface 24a or 24b or via any port or interface of the RF component 10 towards another RF component or towards antenna line devices connected to the RF component 10.

Figure 5:
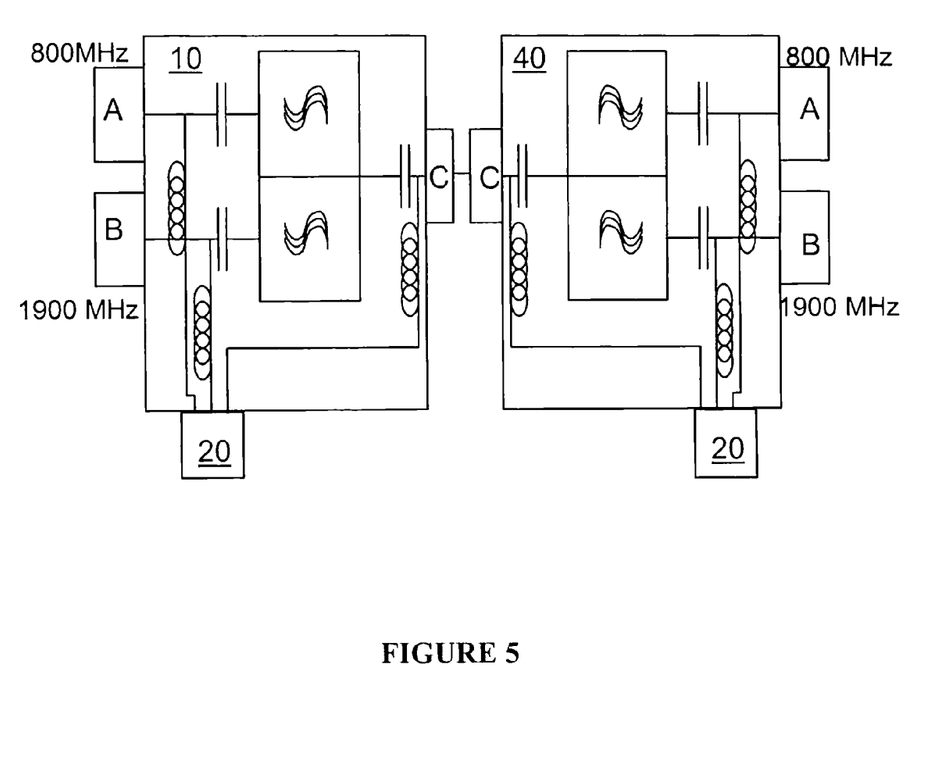
FIG. 5 illustrates a schematic cross section illustration of two interconnected RF components each of which is equipped with an apparatus according to an embodiment of the present invention.

FIG. 5 illustrates an exemplary embodiment of the present invention wherein two interconnected RF components 10 and 40 each of which is equipped with an apparatus 20. As illustrated, the three-port RF component 10 receives RF signals of e.g. a GSM system (800 MHz); control signals and DC power signals via a first RF port A and RF signals of e.g. a WCDMA system (1900 MHz); control signals and DC power signals via a second RF port B. The RF component 10 then separates the controls signals and the DC power signals from the RF signals (both 800 MHz and 1900 MHz RF signals) and apparatus 20 of the first RF component 10 subsequently controls the DC power signals and the control signals received at port A (800 MHz) towards port C and apparatus 20 of the second RF component 40 controls the received DC power signals and control signals at port C towards both port A and port B of the second RF component 40.

Apparatuses 20 of RF components 10 and 40 may further combine received and separated control signals at 800 MHz incident to a first port A with control signals at 1900 MHz incident to the second port B and forward the combined signals towards port C of the RF component 10. In such case, apparatus 20 comprises a signal combiner. Similarly, apparatus 20 may split combined control signals of any frequency band towards any other ports of the RF component 10 or the RF component 40. In such case, apparatus 20 comprises both a signal combiner and a signal splitter. In addition, apparatus 20 of the RF components 10 and 40 may terminate the control signal/signals incident to one port of the RF component to prevent the RF component from guiding the control signal/signals towards other port/ports of the RF component.

Note that the signal combiner and the signal splitter of apparatus 20 may be part of the impedance matching interface network and/or the DC and signalling controller of apparatus 20.

Figure 6:
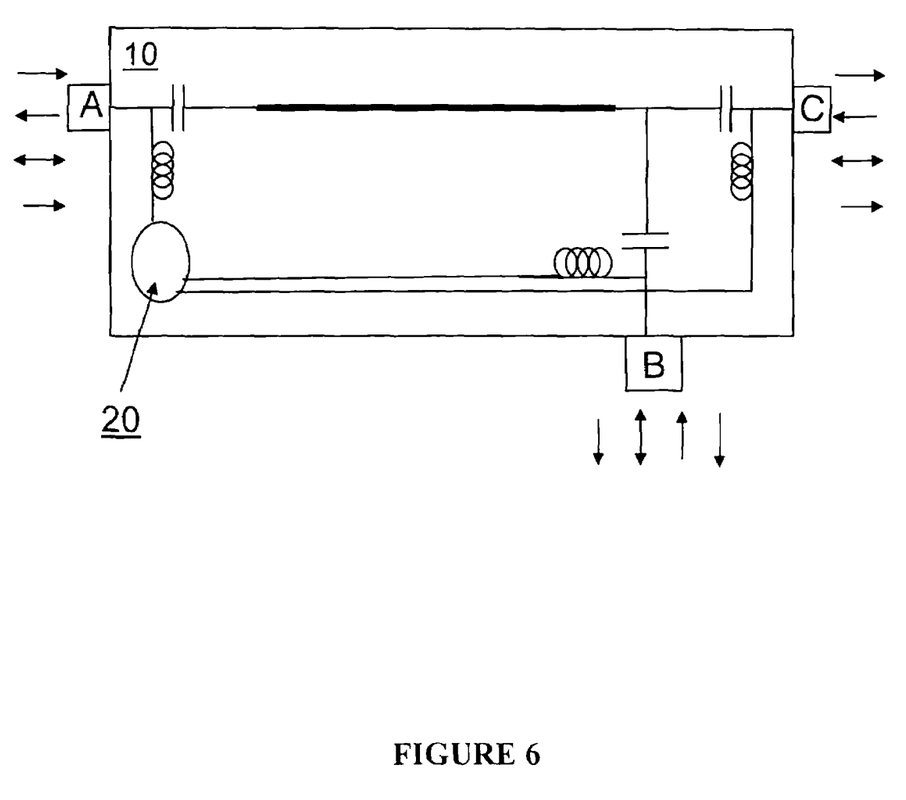
FIG. 6 illustrates a schematic cross section illustration of an RF component incorporating an apparatus in accordance with an embodiment of the present invention.

According to another embodiment of the present invention, apparatus 20 is integrated in an RF component 10. This is illustrated in FIG. 6 which shows a 3 dB splitter that is prepared for different DC and signalling configurations. Apparatus 20 is here connected to port A, B and C via an internal interface that comprises at least one pin via which apparatus 20 controls, along DC paths, DC power signals to at least a first port of the RF component 10 and controls, along signalling paths, control signals towards at least a second port of the RF component 10. Similarly to previously described embodiments, the integrated apparatus 20 comprises at least one impedance matching interface network. Note that all embodiments described earlier concerning the structure or structures of apparatus 20 apply also for the internally integrated apparatus 20 of FIG. 6.

Figure 7:
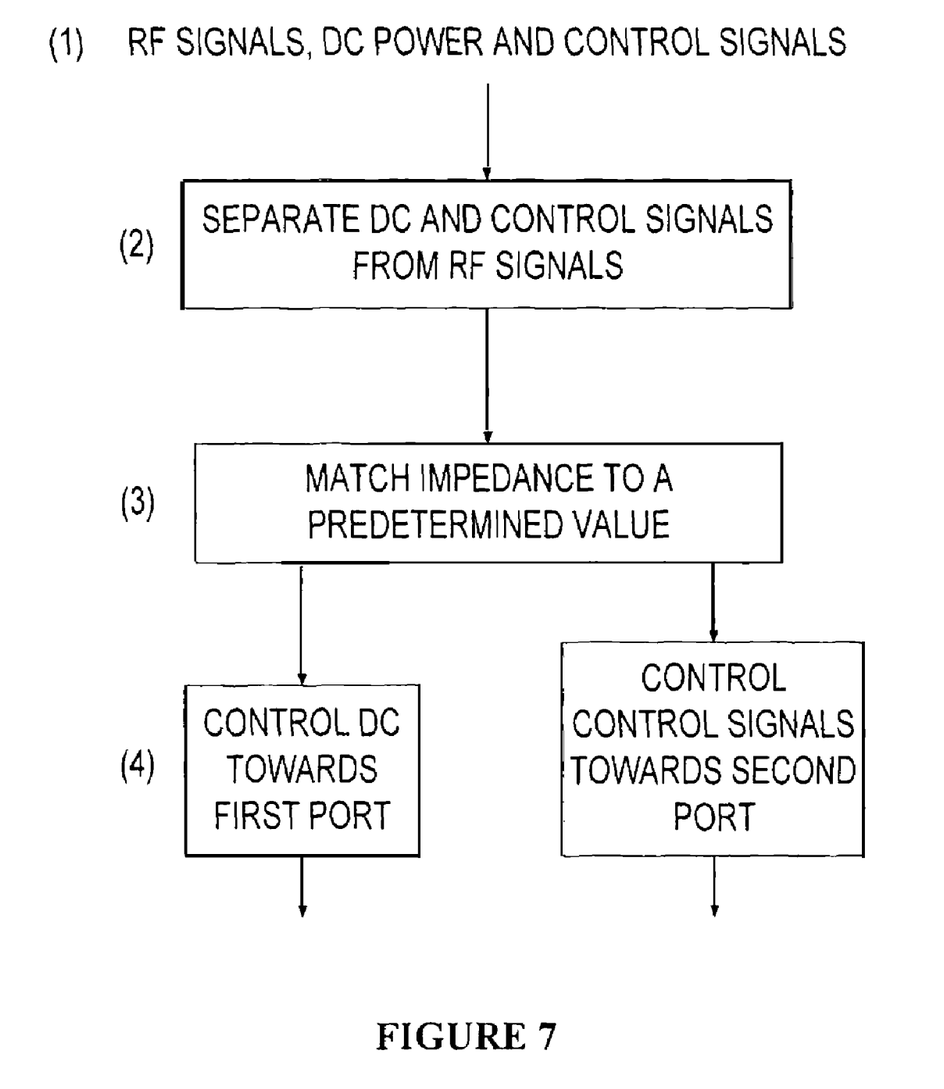
FIG. 7 is a flowchart of a method for signal control in an RF component according to the present invention.

Referring to FIG. 7, there is illustrated a flowchart of a method for signal control in an RF component adapted to be used in antenna systems, in accordance with another aspect of the present invention. At step 1, RF signals, control signals and DC power signals are received at one or several ports of the RF component. The RF component then separates, at step 2, the control signals and the DC power signals from the RF signals and an impedance matching of at least one of the separated control signals to a predetermined impedance values is performed at step 3. The DC power signals are further, at step 4, controlled, along DC paths, towards at least one first port of the RF component whereas the controlled signals are controlled, along signalling paths, to at least a second port of the RF component, whereby, the DC power signals and the control signals are controlled independently of each other.

According to an embodiment of the present invention, the above described method further comprises providing a low impedance between at least two DC paths along which the DC power signals are controlled to a first port of the RF component.

According to another embodiment of the present invention the above described method further comprises providing a high impedance between at least two DC paths, along which DC power signals are controlled.

According to yet another embodiment of the present invention, the above described method further comprises feeding DC power from one or several external power sources via at least one interface, towards at least one port of the RF component and injecting and/or ejecting control signals via at least one interface to/from at least one port of the RF component.

According to a further embodiment of the present invention, the above described method further comprises remotely controlling and/or remotely monitoring the RF component using the control signals in accordance with any of the above mentioned protocols.

A person skilled in the art appreciates that the present invention can be realised in many ways. As an example, the matching network interface and the DC signalling controller may be integrated into a signal unit. The present invention is therefore not restricted to the block diagrams illustrated in the previously described figures. In addition, the apparatuses according to the present invention can be realised in hardware with means of digital circuits and as software in a signal processing circuit. Furthermore the RF component, which might be an active RF component, or a passive RF component, and the apparatus for control of DC power signals and control signals may be used in outdoor antenna systems and indoor antenna systems adapted for use in telecommunications systems. AMPS, PCS (Personal Communication System), PCN (Personal Communication Network), JDC (Japanese Digital Cellular), GSM (Global System for Mobile Communications), GPRS General Packet Radio Service), EDGE (Enhanced Data rates for GSM Evolution), WCDMA (Wide band Code Division Multiplexing Access), CDMA2000 (Code Division Multiplex Access), GPS (Global Positioning System), WLAN (Wireless Local Area Network) and WIMAX (Worldwide Interoperability for Microwave Access) are examples of telecommunications systems in which the present invention may be implemented.

While the invention has been described in terms several embodiments, it is contemplated that alternatives, modifications, permutations and equivalents thereof will become apparent to those skilled in the art upon reading of the specifications and study of the drawings. It is therefore intended that the following appended claims include such alternatives modifications, permutations and equivalents as fall within the scope of the present invention.

The invention claimed is:

1. An apparatus for at least one radio frequency (RF) component for use in antenna systems, where the RF component is adapted to guide direct current (DC) power signals, control signals, and RF signals, and where the RF component is adapted to separate the DC power signals and the control signals from the RF signals, the apparatus comprising:
an impedance matching interface network to match at least one signal of the separated control signals to at least one predetermined impedance value; and
a DC and signalling controller to:
control, along DC paths, the DC power signals to at least one first port of the RF component; and
control, along signalling paths, the control signals to at least one second port of the RF component, where the DC power signals and the control signals are controlled independently of each other.

2. The apparatus according to claim 1, where the DC and signalling controller is further to provide low impedance between at least two DC paths, along which the DC power signals are controlled to at least one port of the RF component.

3. The apparatus according to claim 1, where the DC and signalling controller is further to provide high impedance between at least two DC paths, along which the DC power signals are controlled to at least one RF port of the RF component.

4. The apparatus according to claim 1, further comprising:
at least one DC power feeder to feed DC power to at least one port of the RF component via at least a first interface through which DC power signals are injected from at least one external power source.

5. The apparatus according to claim 1, further comprising:
at least a second interface through which control signals are injected or ejected to/from at least one port of the RF component along at least one of the signalling paths.

6. The apparatus according to claim 1, further comprising:
at least one DC blocker to block at least one DC path in the apparatus to control transfer of at least one DC power signal to at least one port of the RF component.

7. The apparatus according to claim 1, further comprising:
at least one signalling blocker to block at least one signalling path in the apparatus to control the transfer of at least one control signal to at least one port of the RF component.

8. The apparatus according to claim 1, further comprising:
a signal combiner to combine at least two of the control signals in the apparatus; and
a signal splitter to split the control signals in the apparatus.

9. The apparatus according to claim 1, further comprising:
a switch to switch to at least one of a selected function, configuration, or reconfiguration of the RF component, such that the apparatus controls power signals and control signals along selected DC paths and selected signalling paths towards at least one port of the RF component.

10. The apparatus according to claim 1, where the control signals are of lower frequencies than the RF signals, and
where the control signals comprise signals in accordance with one or more of an Antenna Interface Standards Group (AISG) protocol, an Ericsson Remote Electrical Tilt (RET) protocol, or an Ericsson Tower Mounted Amplifier (TMA) control protocol, adapted to control the antenna systems.

11. A method for control of at least one radio frequency (RF) component for use in antenna systems, where the RF component is adapted to guide direct current (DC) power signals, control signals, and RF signals, and where the RF component is adapted to separate the DC power signals and the control signals from the RF signals, the method comprising:
impedance matching at least one signal of the separated control signals to at least one predetermined impedance value;
controlling, along DC paths, the DC power signals to at least one first port of the RF component; and
controlling, along signalling paths, the control signals to at least one second port of the RF component,
where the DC power signals and the control signals are controlled independently of each other.

12. The method according to claim 11, further comprising:
providing low impedance between at least two DC paths, along which the DC power signals are controlled to at least one RF port of the RF component.

13. The method according to claim 11, further comprising:
providing high impedance between at least two DC paths, along which the DC power signals are controlled to at least one RF port of the RF component.

14. The method according to claim 11, further comprising:
feeding DC power to at least one port of the RF component via at least one interface through which DC power is injected from at least one external power source.

15. The method according to claim 11, further comprising:
at least one of injecting or ejecting the control signals to/from at least one port of the RF component via at least one interface.

16. The method according to claim 11, further comprising:
blocking DC power in at least one DC path in order to control at least one DC power signal to at least one port of the RF component.

17. The method according to claim 11, further comprising:
at least one of remotely controlling or remotely monitoring the RF component in the antenna systems, using the control signals comprising signals in accordance with one or more of an Antenna Interface Standards Group (AISG) protocol, an Ericsson Remote Electrical Tilt (RET) protocol, or an Ericsson Tower Mounted Amplifier (TMA) control protocol, adapted to control the antenna systems.

* * * * *